(12) United States Patent
Nakashima (10) Patent No.: US 7,042,041 B2
(45) Date of Patent: May 9, 2006

(54) SEMICONDUCTOR DEVICE

(75) Inventor: Yuichi Nakashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/793,796

(22) Filed: Mar. 8, 2004

(65) Prior Publication Data

US 2004/0238870 A1 Dec. 2, 2004

(30) Foreign Application Priority Data

Mar. 11, 2003 (JP) ............................. 2003-065072

(51) Int. Cl.
*H01L 27/108* (2006.01)
*H01L 29/76* (2006.01)
*H01L 29/94* (2006.01)
*H01L 31/119* (2006.01)

(52) U.S. Cl. ...................... 257/303; 257/306; 257/532; 257/533; 257/534; 257/535

(58) Field of Classification Search ................. 257/303, 257/306, 532–535

See application file for complete search history.

(56) References Cited

U.S. PATENT DOCUMENTS

| 6,342,734 | B1 | 1/2002 | Allman et al. | |
|---|---|---|---|---|
| 6,459,117 | B1 | 10/2002 | Liou | |
| 6,617,666 | B1 * | 9/2003 | Yoshitomi et al. | 257/535 |
| 6,630,705 | B1 * | 10/2003 | Maeda et al. | 257/306 |

FOREIGN PATENT DOCUMENTS

| JP | 2001-274328 | 10/2001 |
|---|---|---|
| JP | 2001-274340 | 10/2001 |
| JP | 2002-329790 | 11/2002 |

OTHER PUBLICATIONS

U.S. Appl. No. 10/626,592, filed Jul. 25, 2003, Matsunaga et al.
U.S. Appl. No. 10/793,796, filed Mar. 8, 2004, Nakashima.

* cited by examiner

*Primary Examiner*—Thien F. Tran
(74) *Attorney, Agent, or Firm*—Oblon, Spivak, McClelland, Maier & Neustadt, P.C.

(57) ABSTRACT

There is here disclosed a semiconductor device comprising a capacitor provided on a substrate and formed by sandwiching a capacitive insulating film between lower and upper electrodes, an interlayer insulating film of an n-th layer (n is 1 or greater integer) provided on the substrate to cover the capacitor, and a plurality of plugs and a plurality of wirings provided on the substrate, wherein an electrode wiring among the wirings which is electrically connected to the lower or upper electrode above the capacitor is provided in an interlayer insulating film of an (n+1)-th layer or more formed on the interlayer insulating film of the n-th layer.

25 Claims, 8 Drawing Sheets

SEMICONDUCTOR DEVICE

CROSS-REFERENCE TO RELATED APPLICATIONS

This application is based upon and claims the benefit of priority from prior Japanese Patent Application No. 2003-065072, filed Mar. 11, 2003, the entire contents of which are incorporated herein by reference.

BACKGROUND OF THE INVENTION

1. Field of the Invention

The present invention relates to a wiring structure of a semiconductor device, and more particularly to a semiconductor device designed to improve contact characteristics between a capacitor and a wiring electrically connected to lower and upper electrodes thereof.

2. Description of the Related Art

Generally, the upper and lower electrodes of the capacitor provided in the semiconductor device are electrically connected to a wiring, a plug or the like thereabove. Such a technology is disclosed in, e.g., Jpn. Pat. Appln. KOKAI Publication No. 2001-274328, 2001-274340 or the like.

In the above structure, for example, the wiring is bulged to the outside of the upper and lower electrodes of the capacitor to be formed thereabove. In this case, if a wiring groove for providing the wiring is formed to a prescribed depth or more, there is a fear that a bottom surface of the wiring will be brought into planar (full) contact with a layer (film) selected from the upper electrode, a capacitive insulating film, and the lower electrode of the capacitor. If the wiring is brought into planar contact with the capacitor, film stress occurs on a contact interface between the wiring and one of the layers of the capacitor, easily causing film peeling-off failures.

Additionally, if the wiring groove is formed to the prescribed depth or more, there is a fear that the wiring for electrically interconnecting via-plugs electrically connected to electrodes of similar polarities originally will be brought into electric contact with electrodes of different polarities. Specifically, there is a fear that the wiring electrically connected only to the upper electrode of the capacitor will be brought into electric contact with the lower electrode thereof. If the wiring electrically connected to the upper electrode is brought into electric contact with the lower electrode, short-circuiting occurs between the lower and upper electrodes. In other words, an electric characteristic failure of the capacitor (characteristic deterioration failure of the capacitor) occurs.

BRIEF SUMMARY OF THE INVENTION

According to an aspect of the invention, there is provided a semiconductor device comprising: a capacitor provided above a substrate and formed by sandwiching a capacitive insulating film between lower and upper electrodes; an interlayer insulating film of an n-th layer (n is 1 or greater integer) provided above the substrate to cover the capacitor; and a plurality of plugs and a plurality of wirings provided above the substrate, wherein an electrode wiring among the wirings which is electrically connected to the lower or upper electrode above the capacitor is provided in an interlayer insulating film of an (n+1)-th layer or more formed on the interlayer insulating film of the n-th layer, and the electrode wiring is electrically connected to the lower or upper electrode via an electrode plug among the plugs, the electrode plug being formed into an isolated island shape so as not to be laid on an edge part of each electrode above the capacitor, having an upper end which is approximately equal in height as an upper surface of the interlayer insulating film of the n-th layer, and being provided in the interlayer insulating film of the n-th layer.

According to another aspect of the invention, there is provided a semiconductor device comprising: a capacitor provided above a substrate and formed by sandwiching a capacitive insulating film between lower and upper electrodes; an interlayer insulating film of an n-th layer (n is 1 or greater integer) provided above the substrate to cover the capacitor; and a plurality of plugs and a plurality of wirings provided above the substrate, wherein an electrode wiring among the wirings which is electrically connected to the lower or upper electrode in the interlayer insulating film of the n-th layer is formed into an isolated island shape so as not to be laid on an edge part of each electrode above the capacitor, the upper electrode is formed smaller than the lower electrode, the lower and upper electrodes are electrically connected to respective electrode upper-layer wirings via respective electrode wirings, and the respective electrode upper-layer wirings are among the wirings provided in an interlayer insulating film of an (n+1)-th layer or more.

According to yet another aspect of the invention, there is provided a semiconductor device comprising: a capacitor provided above a substrate and formed by sandwiching a capacitive insulating film between lower and upper electrodes; an interlayer insulating film of an n-th layer (n is 1 or greater integer) provided above the substrate to cover the capacitor; a plurality of plugs and a plurality of wirings provided above the substrate; and a protective insulating film formed on a surface of the upper electrode to protect the upper electrode separately from the interlayer insulating film of the n-th layer, wherein an electrode wiring among the wirings which is electrically connected to the lower or upper electrode in the interlayer insulating film of the n-th layer is formed into an isolated island shape so as not to be laid on an edge part of each electrode above the capacitor, the lower and upper electrodes are electrically connected to respective electrode upper-layer wirings via respective electrode wirings, and the respective electrode upper-layer wirings are among the wirings provided in an interlayer insulating film of an (n+1)-th layer or more.

DETAILED DESCRIPTION OF THE INVENTION

Figure 14A:
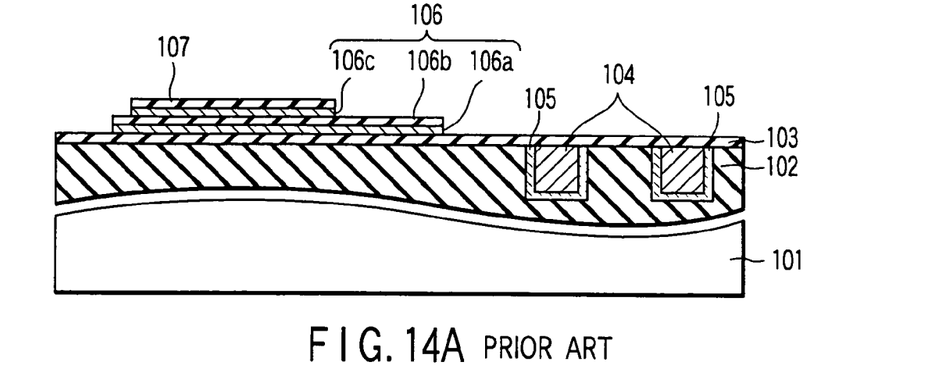
FIG. 14A is a sectional view showing a manufacturing process of a semiconductor device according to a conventional art as a comparative example to the first to fourth embodiments.
Figure 14B:
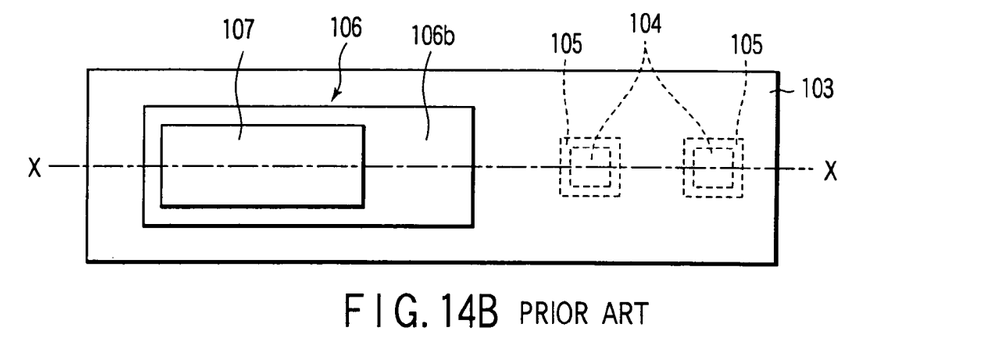
FIG. 14B is a plan view corresponding to FIG. 14A showing the manufacturing process of the semiconductor device according to the conventional art as the comparative example to the first to fourth embodiments.
Figure 15:
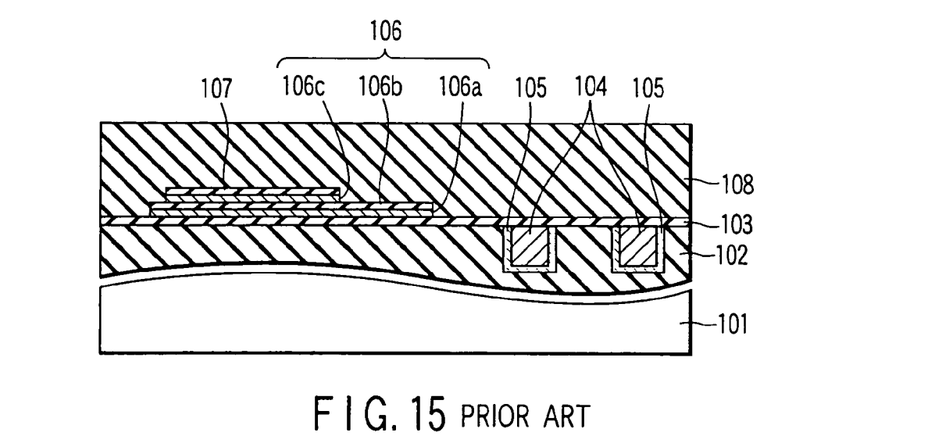
FIG. 15 is a sectional view showing the manufacturing process of the semiconductor device according to the conventional art as the comparative example to the first to fourth embodiments.
Figure 16:
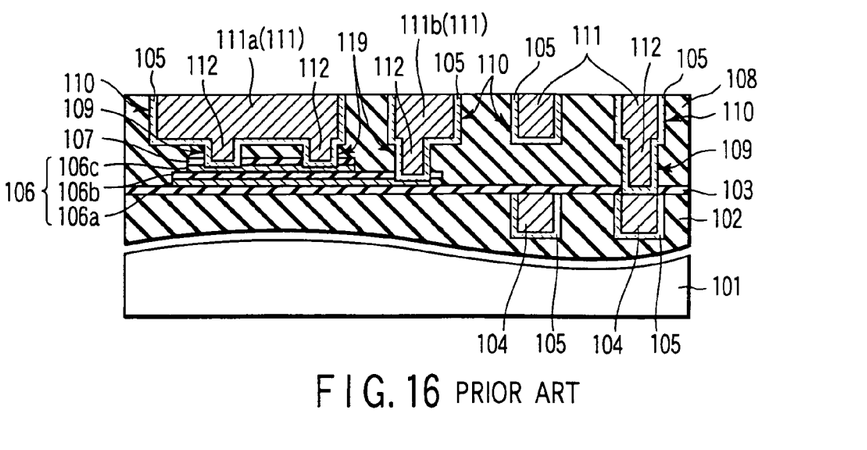
FIG. 16 is a sectional view showing the manufacturing process of the semiconductor device according to the conventional art as the comparative example to the first to fourth embodiments.
Figure 17A:
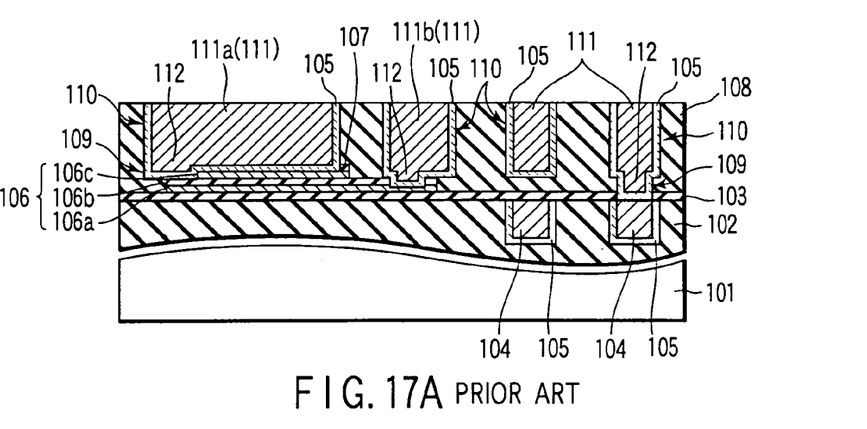
FIG. 17A is a sectional view showing the manufacturing process of the semiconductor device according to the conventional art as the comparative example to the first to fourth embodiments.
Figure 17B:
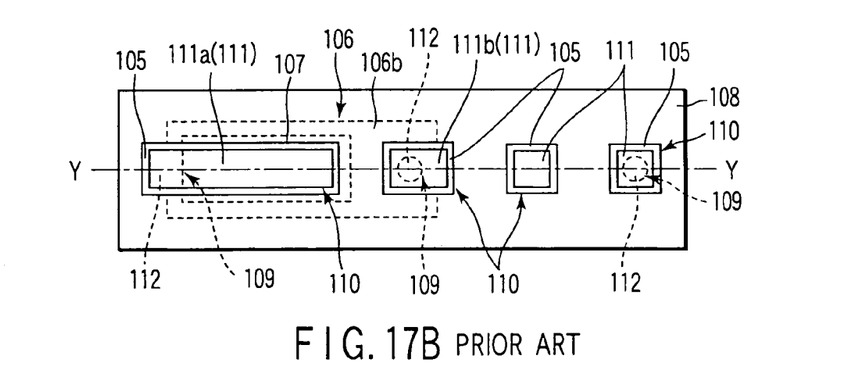
FIG. 17B is a plan view corresponding to FIG. 17A showing the manufacturing process of the semiconductor device according to the conventional art as the comparative example to the first to fourth embodiments.

To begin with, the foregoing problems of the conventional art will be specifically described by way of comparative example with reference to FIGS. 14A to 17B prior to explanation of each embodiment of the present invention. FIG. 14A is a sectional view showing a manufacturing process of a semiconductor device according to a conventional art as a comparative example to first to fourth embodiments (described later). FIG. 14B is a plan view corresponding to FIG. 14A showing the manufacturing process of the semiconductor device according to the conventional art as the comparative example. FIGS. 15 and 16 are sectional views showing the manufacturing process of the semiconductor device according to the conventional art as the comparative example. FIG. 17A is a sectional view showing the manufacturing process of the semiconductor device according to the conventional art as the comparative example. FIG. 17B is a plan view corresponding to FIG. 17A showing the manufacturing process of the semiconductor device according to the conventional art as the comparative example.

Next, a wiring structure near a capacitor in the semiconductor device will be briefly described in sequence of manufacturing steps by way of specific example with reference to FIGS. 14A to 17B.

First, as shown in FIGS. 14A and 14B, a diffusion prevention film 103 is provided on an interlayer insulating film 102 of an (n−1)-th layer (n is an integer of 2 or greater) formed on a substrate 101. A wiring 104 of an (n−1)-th layer and a barrier metal film 105 are formed in the interlayer insulating film 102. Subsequently, a capacitor 106 is provided on the diffusion prevention film 103. Specifically, on the diffusion prevention film 103, a titanium nitride layer (film) 106a that becomes a lower electrode of the capacitor 106, a silicon nitride layer (film) 106b that becomes a capacitive insulating film thereof, and a titanium nitride layer (film) 106c that becomes an upper electrode thereof are formed in order from a lower side. Accordingly, the planar capacitor 106 is formed on the diffusion prevention film 103. Subsequently, a silicon nitride layer (film) 107 is formed on the titanium nitride layer 106c. The silicon nitride layer 107 functions as a stopper layer (film) when a via-hole is formed on the capacitor 106. Incidentally, FIG. 14A is a sectional view cut along the chain line X—X of FIG. 14B.

Next, as shown in FIG. 15, an interlayer insulating film 108 of an n-th layer is formed on the diffusion prevention film 103 to cover the capacitor 106. Subsequently, a surface (top surface) of the interlayer insulating film 108 is planarized by, e.g., a CMP method.

Next, as shown in FIG. 16, a via-hole 109 and a wiring groove 110 are formed in the interlayer insulating film 108. Subsequently, after copper (Cu) as a wiring material, and a material for forming the barrier metal film 105 are embedded in the via-hole 109 and the wiring groove 110, a surface (top surface) of the interlayer insulating film 107 is treated by the CMP method. Accordingly, the lower and upper electrodes 106a and 106c of the capacitor 106, a wiring 111 of an n-th layer electrically connected to the wiring 104 of the (n−1)-th layer, a via-plug (contact plug) 112, and the barrier metal film 105 are formed.

As shown in FIG. 16, among the wirings 111, e.g., wirings 111a, 111b formed on the barrier metal film 105 are formed large so as to be bulged to the outside of the upper electrode 106c or the lower electrode 106a. In this case, if the wiring groove 110 is formed to a prescribed depth or more, as shown in FIG. 17A, there is a fear that bottom surfaces of the wirings 111a, 111b will be brought into planar contact with one of the layers (films) of the capacitor 106. The planar (full-surface) contact of the wirings 111a, 111b with the capacitor 106 generates film stress on a contact interface between the wirings 111a, 111b and one of the layers (films) of the capacitor 106, easily causing peeling-off failures.

Additionally, there is a fear that the wiring 111a for electrically interconnecting the via-plugs 112 electrically connected to electrodes of similar polarities originally will be brought into electric contact with electrodes of different polarities. That is, there is a fear that the wiring 111a electrically connected only to the upper electrode 106c of the capacitor 106 will be brought into electric contact with the lower electrode 106a thereof. The electric contact of the wiring 111a with the lower electrode 106a causes electric characteristic failures of the capacitor 106 (capacitor characteristic deterioration failures) such as short-circuiting between the lower electrode 106a and the upper electrode 106c. Incidentally, FIG. 17A is a sectional view cut along the chain line Y-Y of FIG. 17B.

Each of first to fourth embodiments (described later) is designed to solve the foregoing problems, and an object thereof is to provide a semiconductor device wherein contact characteristics between a capacitor and a wiring electrically connected to lower and upper electrodes thereof are improved to suppress peeling-off failures or electric characteristic failures (deterioration) of the capacitor, thereby enhancing reliability.

Next, the embodiments of the present invention will be described with reference to the accompanying drawings.

First Embodiment

Figure 3A:
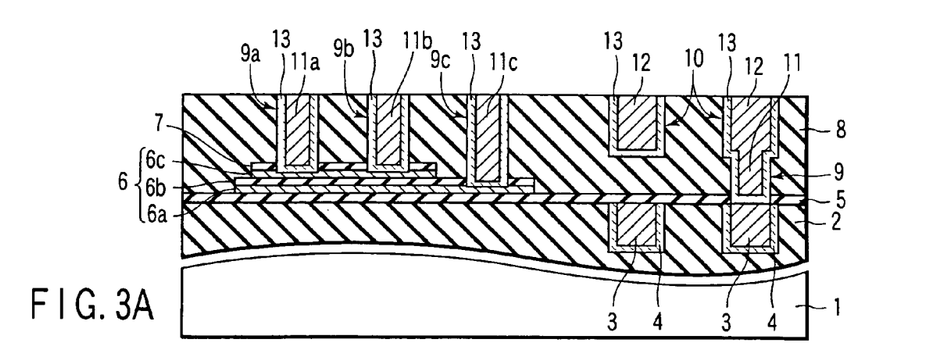
FIG. 3A is a sectional view showing the manufacturing process of the semiconductor device according to the first embodiment.
Figure 3B:
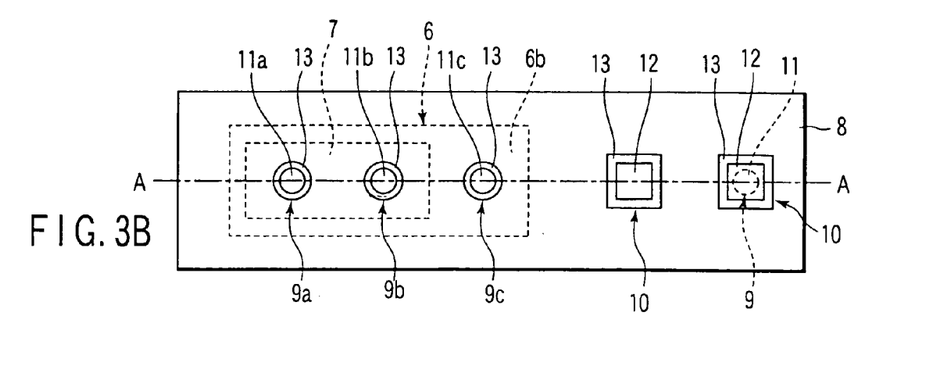
FIG. 3B is a plan view corresponding to FIG. 3A showing the manufacturing process of the semiconductor device according to the first embodiment.
Figure 4:
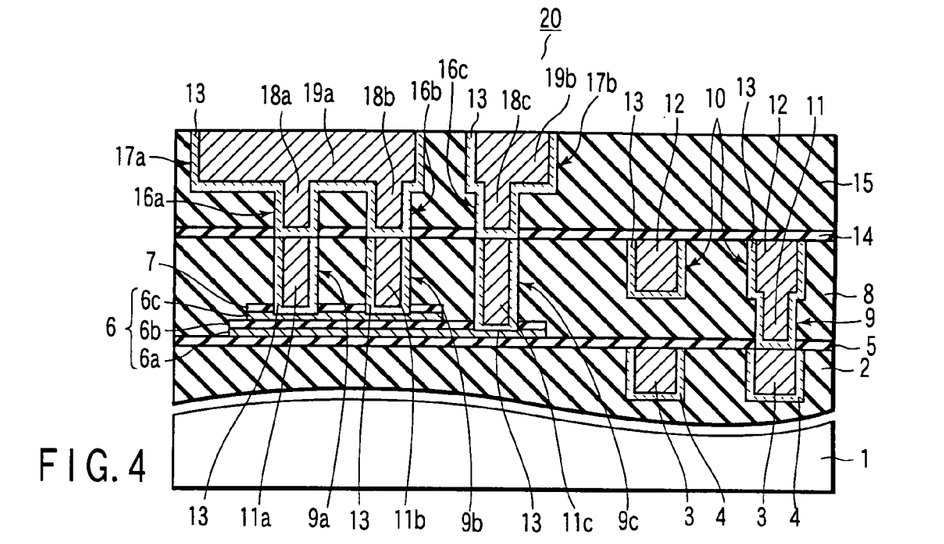
FIG. 4 is a sectional view showing the semiconductor device and the manufacturing process thereof according to the first embodiment.

To begin with, the first embodiment of the present invention will be described by referring to FIGS. 1 to 4. FIGS. 1 to 3A are sectional views showing a manufacturing process of a semiconductor device according to the embodiment. FIG. 3B is a plan view corresponding to FIG. 3A showing the manufacturing process of the semiconductor device according to the embodiment. FIG. 4 is a sectional view showing the semiconductor device and the manufacturing process thereof according to the embodiment.

According to the embodiment, among a plurality of wirings provided on a substrate, an electrode wiring electrically connected to a lower or upper electrode of a capacitor thereabove is provided in an interlayer insulating film of an (n+1)-th layer formed on an interlayer insulating film of an n-th layer in which the capacitor is provided. Hereinafter, the semiconductor device of the embodiment and the manufacturing method thereof will be described collectively in sequence of manufacturing steps.

Figure 1:
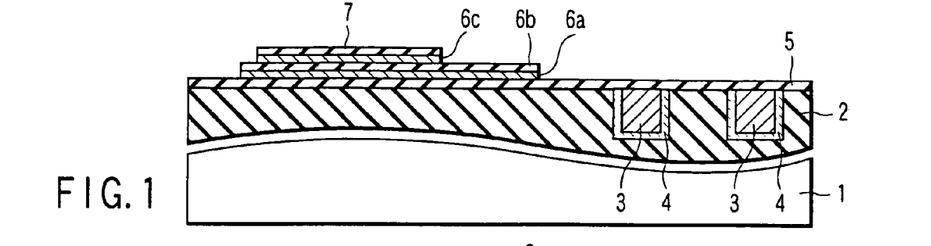
FIG. 1 is a sectional view showing a manufacturing process of a semiconductor device according to a first embodiment.

First, as shown in FIG. 1, an interlayer insulating film 2 of an (n−1)-th layer (n is an integer of 2 or greater) made of d-TEOS is provided on a semiconductor substrate (silicon substrate) 1 in which an active region or the like is formed to constitute various electronic circuits (not shown) by, e.g., a CVD method. Subsequently, a plurality of wirings (lower-layer wirings) 3 of an (n−1)-th layer and a plurality of barrier metal films 4 are embedded to be formed in the interlayer insulating film 2. Each lower-layer wiring 103 is made of, e.g., Cu. Each barrier metal film 4 is made of, e.g., TaN, TiN or the like. Subsequently, a diffusion prevention film 5 made of SiN is formed on a surface (top surface) of the interlayer insulating film 2 in which the lower-layer wiring 3 etc., have been formed by, e.g., a CVD method.

Then, a planar capacitor (capacitor element) 6 is provided on the diffusion prevention film 5. Specifically, first, a titanium nitride film 6a is deposited on a position shifted from above the substrate wiring 3 to cover a part of a surface of the diffusion prevention film 5, thereby becoming a lower electrode of the capacitor 6. Subsequently, a silicon nitride film 6b is deposited to cover a full surface of the titanium nitride film 6a, thereby becoming a capacitive insulating film (capacitor insulating film) of the capacitor 6. Subsequently, a titanium nitride film 6c is deposited to cover a part of a surface of the silicon nitride film 6b, thereby becoming an upper electrode of the capacitor 6. These films 6a, 6b, 6c are formed by, e.g., a sputtering method.

Then, a silicon nitride film 7 is deposited to cover a full surface of the titanium nitride film 6c by a sputtering method, thereby becoming a protective insulating film 7 to protect the same. This silicon nitride film 7 functions as a stopper film when via-holes 9a, 9b are formed (described later).

Figure 2:
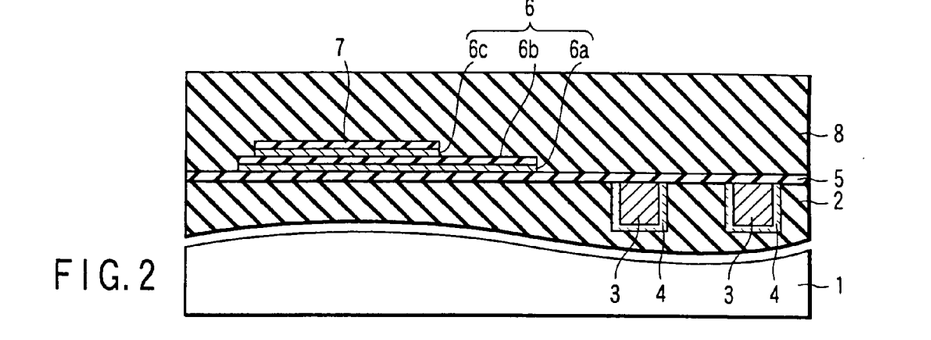
FIG. 2 is a sectional view showing the manufacturing process of the semiconductor device according to the first embodiment.

Next, as shown in FIG. 2, an interlayer insulating film 8 of an n-th layer made of d-TEOS is formed on the surface of the diffusion prevention film 5 to cover the capacitor 6 in which the protective insulating film 7 is provided by a CVD method. Subsequently, a surface of the interlayer insulating film 8 is planarized by, e.g., a CMP method.

Next, as shown in FIGS. 3A and 3B, a plurality of via-holes (contact holes) 9, 9a, 9b, 9c are provided at predetermined places in the interlayer insulating film 8 by using a lithography technology and an etching technology to form a plurality of via-plugs (contact plugs) 11, 11a, 11b, 11c of an n-th layer. Similarly, a plurality of recess for wiring (wiring grooves) 10 are provided at predetermined places in the interlayer insulating film 8 to form a plurality of wirings 12 of an n-th layer. Incidentally, FIG. 3A is a sectional view cut along the chain line A—A of FIG. 3B.

The recesses 10 are formed by one above every two lower-layer wirings 3. One recess 10 is formed through the interlayer insulating film 8 and the diffusion prevention film 5 integrally with the via-hole 9. The other recess 10 is not accompanied by the via-hole 9 but formed as a single recess for wiring. The via-holes 9a, 9b are both formed through the protective insulating film 7 above the upper electrode 6c of the capacitor 6. Additionally, the via-hole 9c is formed through the capacitive insulating film 6b above a region (portion) of the lower electrode 6a of the capacitor 6 on which the upper electrode 6c is not laid. The via-holes 9a, 9b, 9c are all formed as single via-holes without being accompanied by the recesses for wirings 10.

As shown in FIGS. 3A and 3B, the via-holes 9a, 9b are formed in positions, sizes and shapes so as not to expose edges of the upper electrode 6c even if they are formed in diameters larger than a prescribed size due to an overetching phenomenon or the like. That is, in positions shifted from the edges of the upper electrode 6c, the via-holes 9a, 9b are formed into sizes and shapes so as not to be laid on, cross or step over the edges thereof.

Specifically, in positions apart from the edges of the upper electrode 6c, the via-holes 9a, 9b are formed in sizes so that diameters of via-plugs 11a, 11b formed therein can be about 1 μm or smaller. Accordingly, even if they are formed in diameters larger than the prescribed size due to the overetching phenomenon, there is almost no fear that the via-holes 9a, 9b will be shifted from above the upper electrode 6c to spread to the outside thereof. In other words, there is almost no fear that the via-holes 9a, 9b will spread above the capacitive insulating film 6b or the lower electrode 6a. Thus, even if the via-holes 9a, 9b are formed deeper than a prescribed size due to the overetching phenomenon, there is almost no fear that the capacitive insulating film 6b or the lower electrode 6a will be exposed.

Likewise, the via-hole 9c is formed in a position, a size and a shape so as not to expose edges of the lower and upper electrodes 6a and 6c even if it is formed in a diameter larger than a prescribed size due to the overetching phenomenon. That is, in a position shifted from the edges of the lower and upper electrodes 6a and 6c, the via-hole 9c is formed in a size and a shape so as not to be laid on, cross or step over the edges thereof.

Specifically, in a position apart from the edges of the upper and lower electrodes 6c and 6a, the via-hole 9c is formed in a size so that a diameter of a via-plug 11c formed therein can be about 1 μm or smaller. Accordingly, even if it is formed in a diameter larger than the prescribed size due to the overetching phenomenon, there is almost no fear that the via-hole 9c will be shifted from above the region of the lower electrode 6a on which the upper electrode 6c is not laid. In other words, there is almost no fear that the via-hole 9c will spread to the outside of the lower electrode 6a or above the upper electrode 6c. Thus, even if the via-hole 9c is formed in the diameter larger than the prescribed size due to the overetching phenomenon, there is almost no fear that the upper electrode 6c will be exposed.

Subsequently, barrier metal films 13 are deposited on the surface of the interlayer insulating film 8 and inside the via-holes 9, 9a, 9b, 9c and the recesses for wirings 10 by a CVD method. The barrier metal film 13 is made of, e.g., TaN, TiN or the like as in the case of the barrier metal film 4. Then, Cu films are deposited on the surfaces of the barrier metal films 13 by a CVD method to fill the insides of the via-holes 9, 9a, 9b, 9c and the recesses for wirings 10. The Cu films become materials for forming the via-plugs 11, 11a, 11b, 11c and the wirings 12. Subsequently, the barrier metal films 13 and the Cu films on the surface of the interlayer insulating film 8 are polished to be removed by a CMP method. Accordingly, the barrier metal films 13 and the Cu films are embedded inside the via-holes 9, 9a, 9b, 9c and the recesses for wirings 10. As a result, four via-plugs 11, 11a, 11b, 11c of an n-th layer, and two wirings 12 of an n-th layer are formed together with the barrier metal films 13.

As shown in FIG. 3A, one wiring 12 is formed in a so-called dual damascene structure in which it is integral with the via-plug 11. This dual damascene wiring 12 is electrically connected to one lower-layer wiring 3 through the via-plug 11 and the barrier metal film 13. The other wiring 12 is formed as a single wiring without being accompanied by the via-plug 11 and without being electrically connected to the lower-layer wiring 3. The three via-plugs 11a, 11b, 11c as electrode plugs are all formed as single via-plugs without being accompanied by wirings 12. The electrode plugs 11a, 11b are electrically connected through the barrier metal film 13 to the upper electrode 6c of the capacitor 6. Additionally, the electrode plug 11c is electrically connected through the barrier metal film 13 to the lower electrode 6a of the capacitor 6.

The electrode plugs 11a, 11b are formed into isolated island shapes in the via-holes 9a, 9b so that diameters thereof can be about 1 μm or smaller. That is, in positions apart from the edges of the upper electrode 6c, the electrode plugs 11a, 11b are formed into sizes and shapes so as to be sufficiently smaller than the upper electrode 6c but not to be laid on, cross or step over the edges thereof. The single electrode plugs 11a, 11b formed in such positions, sizes and shapes can be referred to as isolated via-plugs or island-shaped via-plugs.

The isolated island formation of the electrode plugs 11a, 11b enables contact between the electrode plugs 11a, 11b and the upper electrode 6c in a state different from that of, e.g., the upper electrode 6c and the protective insulating film 7 in full contact with each other. The contact state between the upper electrode 6c and the projective insulating film 7 is referred to as, e.g., a surface (planar) contact state. On the other hand, a contact area between the electrode plugs 11a, 11b and the upper electrode 6c is sufficiently smaller compared with that between the upper electrode 6c and the protective insulating film 7. Such a contact state between the electrode plugs 11a, 11b and the upper electrode 6c can be referred to as, e.g., a point contact state with respect to the surface contact state between the upper electrode 6c and the protective insulating film 7.

Substantial point contact between the electrode plugs 11a, 11b and the upper electrode 6c enables suppression of film stress on contact interfaces among the electrode plugs 11a, 11b, the protective insulating film 7 and the upper electrode 6c. As a result, it is possible to make film peeling-off difficult on the upper electrode 6c and the protective insulating film 7. Moreover, it is possible to eliminate almost all fears of electric characteristic failures of the capacitor 6 (capacitor characteristic deterioration failures) caused by film peeling-off failures on the capacitor 6 or the vicinity thereof.

Now, for example, it is assumed that the via-holes 9a, 9b are formed in diameters larger than the prescribed size due to the overetching phenomenon, and the electrode plugs 11a, 11b are formed in diameters larger than the prescribed size. Alternatively, it is assumed that the via-holes 9a, 9b are formed deeper than the prescribed size due to the overetching phenomenon, and the electrode plugs 11a, 11b are formed longer than the prescribed size. However, as described above, the electrode plugs 11a, 11b are formed into the isolated island shapes above the upper electrode 6c and in the positions apart from the region (portion) in which the upper electrode 6c is not laid on the lower electrode 6a. Accordingly, even if the electrode plugs 11a, 11b are formed larger in diameter or longer than the prescribed size, there is almost no fear that the electrode plugs 11a, 11b will reach the capacitive insulating film 6b or the lower electrode 6a.

Especially, it is possible to eliminate almost all fears that the electrode plugs 11a, 11b electrically connected to the upper electrode 6c will be electrically connected to the lower electrode 6a different in polarity from the upper electrode 6c. In other words, it is possible to eliminate almost all fears or the like of short-circuiting caused by electric connection between the upper and lower electrodes 6c and 6a through the electrode plugs 11a, 11b. As a result, it is possible to eliminate almost all fears that electric characteristic failures of the capacitor 6 (capacitor characteristic deterioration failures) will occur.

The electrode plug 11c is formed into an isolated island shape of a diameter set equal to about 1 μm or smaller in the via-hole 9c. That is, in a position apart from the edges of the upper and lower electrodes 6c and 6a, the electrode plug 11c is formed into a size and a shape so as to be sufficiently smaller than a region (portion) of the lower electrode 6a on which the upper electrode 6c is not laid but not to be laid on, cross or step over the edges thereof. The single electrode plug 11c formed in such a position, a size and a shape can also be referred to as an isolated via-plug or an island-shaped via-plug.

The isolated island formation of the electrode plug 11c as in the case of the electrode plugs 11a, 11b enables substantial point contact of the electrode plug 11c with the lower electrode 6a. Accordingly, it is possible to suppress film stress on contact interfaces among the electrode plug 11c, the capacitive insulating film 6b and the lower electrode 6a. As a result, film peeling-off can be made difficult on the lower electrode 6a and the capacitive insulating film 6b. Besides, it is possible to eliminate almost all fears of electric characteristic failures of the capacitor 6 caused by film peeling-off failures in the capacitor 6 or the vicinity thereof.

Additionally, for example, it is assumed that the via-hole 9c is formed in a diameter larger than the prescribed size due to the overetching phenomenon, and the electrode plug 11c is formed in a diameter larger than the prescribed size. As described above, however, the electrode plug 11c is formed into the isolated island shape above the region in which the upper electrode 6c is not laid on the lower electrode 6a, and in the position apart from the edges of the upper and lower electrodes 6c and 6a. Accordingly, even if the electrode plug 11c is formed in the diameter larger than the prescribed size, there is almost no fear that the electrode plug 11c will reach the upper electrode 6c. In other words, it is possible to eliminate almost all fears that the electrode plug 11c electrically connected to the lower electrode 6a will be electrically connected to the upper electrode 6c different in polarity from the lower electrode 6a. Thus, it is possible to eliminate almost all fears or the like of short-circuiting caused by electric connection between the lower and upper electrodes 6a and 6c through the electrode plug 11c. As a result, it is possible to eliminate almost all fears that electric characteristic failures of the capacitor 6 will occur.

Next, as shown in FIG. 4, a diffusion prevention film 14 made of SiN is provided on the surface of the interlayer insulating film 8 of the n-th layer on which the electrode plugs 11, 11a, 11b, 11c and the wirings 12 have been formed by a CVD method. Subsequently, an interlayer insulating film 15 of an (n+1)-th layer made of d-TEOS is formed on a surface of the diffusion prevention film 14 by a CVD method. Then, by using a lithography technology and an etching technology, a plurality of via-holes (contact holes) 16a, 16b, 16c are provided at predetermined places in the interlayer insulating film 15 to form a plurality of via-plugs (contact plugs) 18a, 18b, 18c of an (n+1)-th layer. Similarly, a plurality of recesses for wirings (wiring grooves) 17a, 17b are provided at predetermined places in the interlayer insulating film 15 to form a plurality of wirings 19a, 19b of an (n+1)-th layer.

The via-holes 16a, 16b are formed through the diffusion prevention film 14 above the electrode plugs 11a, 11b. The via-hole 16c is formed through the diffusion prevention film 14 above the electrode plug 11c. The recess 17a is formed above the two via-holes 16a, 16b so as to be integrally communicated therewith. Additionally, the recess 17b is formed above the via-hole 16c so as to be integrally communicated therewith.

Subsequently, barrier metal films 13 are deposited on the surface of the interlayer insulating film 15 and inside the via-holes 16a, 16b, 16c and the recesses 17a, 17b by a CVD method. Then, Cu films are deposited on the surfaces of the barrier metal films 13 by a CVD method to fill the insides of the via-holes 16a, 16b and 16c and the recesses 17a, 17b. The Cu films become materials for forming the via-plugs 18a, 18b, 18c and the wirings 12. Subsequently, the barrier metal films 13 and the Cu films on the surface of the interlayer insulating film 15 are polished to be removed by a CMP method. Accordingly, the barrier metal films 13 and the Cu films are embedded inside the via-holes 16a, 16b, 16c and the recesses 17a, 17b. As a result, three via-plugs 18a, 18b, 18c of an (n+1)-th layer, and two electrode wirings 19a, 19b of an (n+1)-th layer are formed together with the barrier metal films 13.

As shown in FIG. 4, the two via-plugs 18a, 18b as electrode upper-layer plugs are electrically connected to the two electrode plugs 11a, 11b electrically connected to the upper electrode 6c of the capacitor 6. Additionally, the electrode wiring 19a as an electrode upper-layer wiring is formed in a dual damascene structure in which it is integral with the electrode upper-layer plugs 18a, 18b. Accordingly, the electrode upper-layer wiring 19a is electrically connected to the electrode plugs 11a, 11b through the electrode upper-layer plugs 18a, 18b and the barrier metal film 13. In other words, the electrode upper-layer wiring 19a formed above the upper electrode 6c of the capacitor 6 in the interlayer insulating film 15 is electrically connected to the upper electrode 6c thereof through the electrode upper-layer plugs 18a, 18b and the electrode plugs 11a, 11b. The electrode plugs 11a, 11b electrically connected to the upper electrode 6c independently of each other in the interlayer insulating film 8 are collected on one current-carrying path by the electrode upper-layer wiring 19a.

Additionally, the via-plug 18c as an electrode upper-layer plug is electrically connected to the electrode plug 11c electrically connected to the lower electrode 6a of the capacitor 6. The electrode wiring 19b as an electrode upper-layer wiring is formed in a dual damascene structure in which it is integral with the electrode upper-layer plug 18c. Accordingly, the electrode upper-layer wiring 19b is electrically connected to the electrode plug 11c through the electrode upper-layer plug 18c and the barrier metal film 13. In other words, the electrode upper-layer wiring 19b formed in a position shifted from above the upper electrode 6c of the capacitor 6 in the interlayer insulating film 15 is electrically connected to the lower electrode 6a thereof through the electrode upper-layer plug 18c and the electrode plug 11c.

Thereafter, a desired semiconductor device 20 shown in FIG. 4 is obtained through predetermined steps. That is, the semiconductor device 20 is obtained in which the electrode upper-layer wirings 19a, 19b electrically connected to the lower electrode 6a or the upper electrode 6c thereabove are provided in the interlayer insulating film 15 one-layer higher than the interlayer insulating film 8 in which the capacitor 6 is provided.

As described above, according to the first embodiment, the electrode upper-layer wirings 19a, 19b electrically connected to the lower electrode 6a or the upper electrode 6c are provided in the interlayer insulating film 15 one-layer higher than the interlayer insulating film 8 in which the capacitor 6 is provided. Thus, even if the electrode upper-layer wirings 19a, 19b are formed larger than the lower electrode 6a or the upper electrode 6c, or in positions, sizes and shapes to cross the edges of the electrodes 6a, 6c, it is possible to eliminate almost all fears of full-surface contact thereof with the lower electrode 6a or the upper electrode 6c. It is accordingly possible to eliminate almost all fears that the electrode upper-layer wirings 19a, 19b will be connected to both of the lower and upper electrodes 6a, 6c. That is, by providing the electrode upper-layer wirings 19a, 19b on the layer different from that of the capacitor 6, it is possible to eliminate almost all fears of contact between the wirings 19a, 19b and the capacitor 6 irrespective of positions, sizes or shapes thereof.

Furthermore, the lower electrode 6a or the upper electrode 6c of the capacitor 6, and the electrode plugs 11a, 11b, 11c electrically connected thereto in the interlayer insulting film 8 are brought into point-contact with each other. Thus, contact characteristics are improved between the lower electrode 6a or the upper electrode 6c of the capacitor 6 and the electrode plugs 11a, 11b, 11c to reduce film stress on each contact portion.

Therefore, in the semiconductor device 20 of the embodiment, film peeling-off failures or electric characteristic failures (deterioration) in the capacitor 6 or the vicinity thereof are suppressed to improve reliability.

Second Embodiment

Figure 5A:
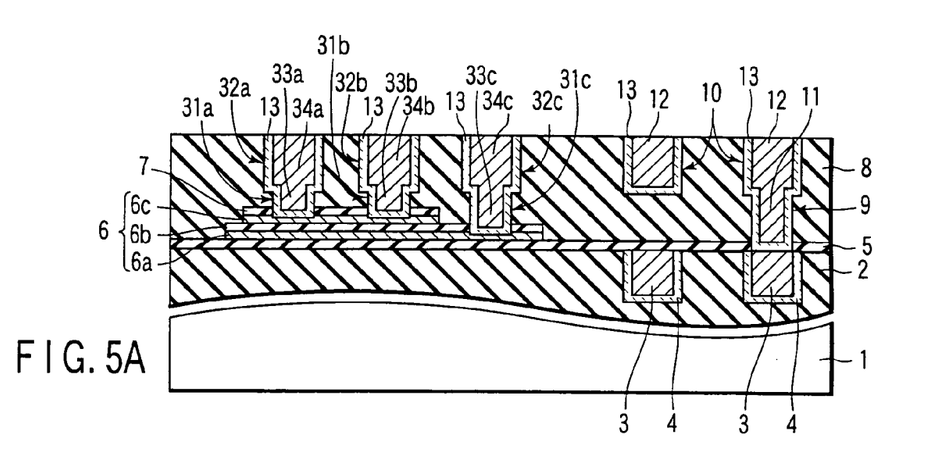
FIG. 5A is a sectional view showing a manufacturing process of a semiconductor device according to a second embodiment.
Figure 5B:
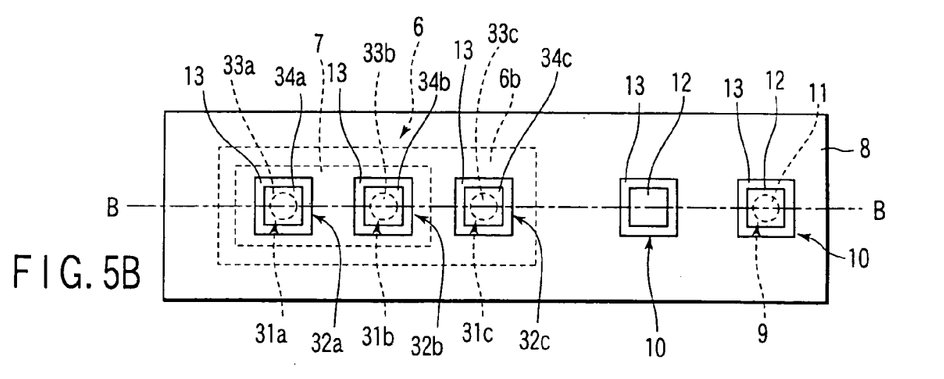
FIG. 5B is a plan view corresponding to FIG. 5A showing the manufacturing process of the semiconductor device according to the second embodiment.
Figure 6:
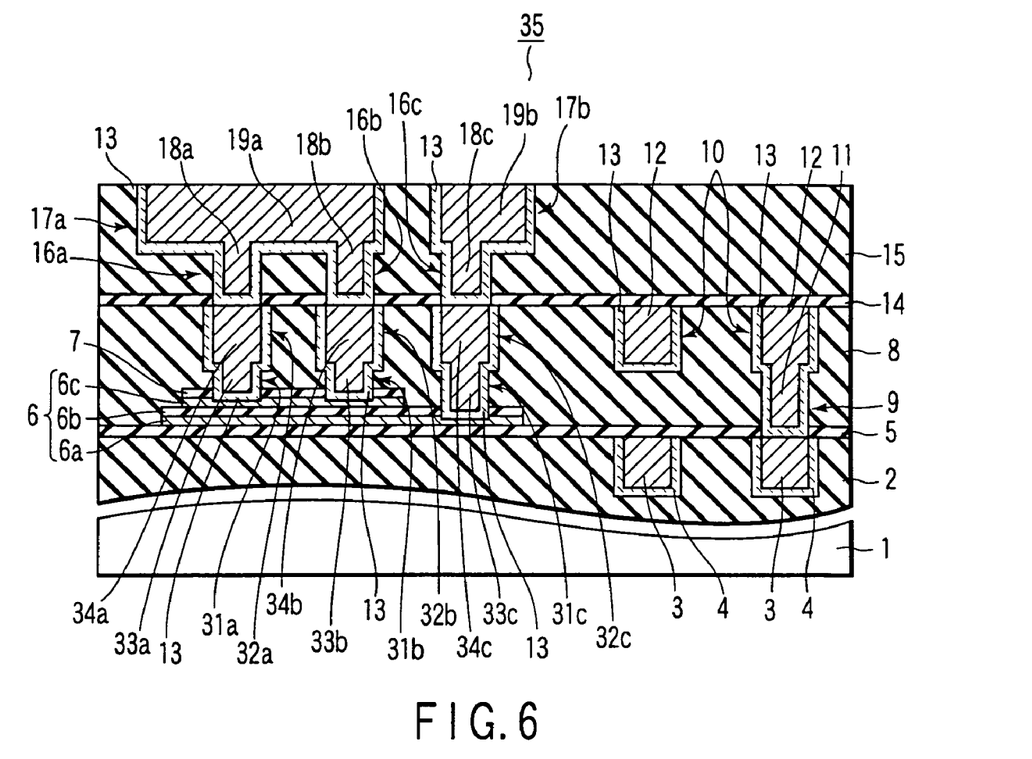
FIG. 6 is a sectional view showing the semiconductor device and the manufacturing process thereof according to the second embodiment.

Next, the second embodiment of the present invention will be described by referring to FIGS. 5A to 6. FIG. 5A is a sectional view showing a manufacturing process of a semiconductor device according to the embodiment. FIG. 5B is a plan view corresponding to FIG. 5A showing the manufacturing process of the semiconductor device according to the embodiment. FIG. 6 is a sectional view showing the semiconductor device and the manufacturing process thereof according to the embodiment. Incidentally, sections similar to those of the first embodiment are denoted by similar reference numerals, and detailed description thereof will be omitted.

According to the embodiment, different from the first embodiment, among a plurality of wirings provided on a substrate, an electrode wiring electrically connected to a lower or upper electrode of a capacitor is formed into an isolated island shape so as not to be laid on edges of the electrodes above the capacitor, and provided in an interlayer insulating film of an n-th layer in which the capacitor is provided. Hereinafter, the semiconductor device of the embodiment and the manufacturing method thereof will be described collectively in sequence of manufacturing steps.

First, as shown in FIGS. 5A and 5B, in the same process as that of the first embodiment, an interlayer insulating film 8 of an n-th layer is provided to cover a capacitor 6 on a surface of a diffusion prevention film 5 in which the capacitor 6 or the like is formed. Subsequently, a surface of the interlayer insulating film 8 is planarized by a CMP method. Incidentally, FIG. 5A is a sectional view cut along the chain line B—B of FIG. 5B.

Subsequently, in the same process as that of the first embodiment, a plurality of via-holes 9, 31a, 31b, 31c, and a plurality of the recesses 10, 32a, 32b, 32c are formed in the interlayer insulating film 8. The via-holes 31a, 31b, 31c are formed similar in position and diameter to the via-holes 9a, 9b, 9c of the first embodiment. However, the recesses 32a, 32b, 32c are formed above the via-holes 31a, 31b, 31c to be communicated therewith integrally. Each of the recesses 32a, 32b, 32c is formed to a depth so that a bottom end (bottom portion) thereof can be positioned higher than a protective insulating film 7 provided in the capacitor 6. In other words, each of the recesses 32a, 32b, 32c is formed to a depth so that there can be almost no fear of exposing a surface of the protective insulating film 7. Especially, the recess 32c is formed side by side with, and roughly similar in depth to the recesses 32a, 32b.

Additionally, as in the case of the via-holes 9a, 9b, 9c of the first embodiment, the recesses 32a, 32b, 32c are formed in positions, sizes and shapes so as not to expose edges of the lower electrode 6a or the upper electrode 6c even if they are formed in diameters larger than a prescribed size due to an overetching phenomenon. That is, in positions shifted from the edges of the lower and upper electrodes 6a and 6c, the recesses 32a, 32b, 32c are formed into sizes and shapes so as not to be laid on, cross or step over the edges thereof. Specifically, in positions apart from the edges of the lower electrode 6a or the upper electrode 6c, the recesses 32a, 32b, 32c are formed in sizes so that diameters of electrode wirings 34a, 34b, 34c of an n-th layer formed therein can be about 1 μm or smaller. Thus, the recesses 32a, 32b, 32c are formed roughly equal in diameter to the via-holes 31a, 31b, 31c formed to be communicated therewith integrally.

Subsequently, in the same process as that of the first embodiment, barrier metal films 13 and Cu films are embedded inside the via-holes 9, 31a, 31b, 31c and the recesses 10, 32a, 32b, 32c. As a result, four via-plugs 11, 33a, 33b, 33c of an n-th layer, and five wirings 12, 34a, 34b, 34c of an n-th layer are formed together with the barrier metal films 13. The wirings 34a, 34b, 34c as electrode wirings are formed in dual damascene structures in which they are integral with the via-plugs 33a, 33b, 33c as electrode plugs. The electrode wirings 34a, 34b are electrically connected to the upper electrode 6c of the capacitor 6 through the electrode plugs 33a, 33b and the barrier metal films 13. Additionally, the electrode wiring 34c is electrically connected to the lower electrode 6a of the capacitor 6 through the electrode plug 33c and the barrier metal film 13.

The electrode wirings 34a, 34b, 34c are formed in thickness so as not to be brought into contact with the protective insulating film 7 in the recesses 32a, 32b, 32c. The electrode wirings 34a, 34b, 34c are formed so that diameters thereof can be about 1 μm or smaller. That is, the electrode wirings 34a, 34b, 34c are formed into isolated island shapes substantially equal in diameter to the electrode plugs 33a, 33b, 33c. Such electrode wirings 34a, 34b, 34c can be referred to as isolated wirings or island-shaped wirings.

Now, for example, it is assumed that the recesses 32a, 32b, 32c are formed in diameters larger than the prescribed size due to the overetching phenomenon, and the electrode wirings 34a, 34b, 34c are formed in diameters larger than the prescribed size. Alternatively, it is assumed that the recesses 32a, 32b, 32c are formed deeper than the prescribed size due to the overetching phenomenon, and the electrode wirings 34a, 34b, 34c are formed longer than the prescribed size. However, as described above, the electrode wirings 34a, 34b, 34c are formed into the isolated island shapes above the electrode plugs 33a, 33b, 33c. Accordingly, even if the electrode wirings 34a, 34b, 34c are formed larger in diameter or longer than the prescribed size, there is almost no fear that the electrode wirings 34a, 34b, 34c will reach the upper electrode 6c, the capacitive insulating film 6b or the lower electrode 6a of the capacitor 6, or the protective insulating film 7.

Even if the electrode wirings 34a, 34b reach the upper electrode 6c of the capacitor 6, the isolated island formation of the wirings 34a, 34b enables substantial point contact thereof with the upper electrode 6c. Accordingly, even if the electrode wirings 34a, 34b reach the upper electrode 6c, it is possible to suppress film stress on contact interfaces among the wirings 34a, 34b, the upper electrode 6c and the protective insulating film 7. As a result, film peeling-off can be made difficult on the upper electrode 6c and the protective insulating film 7.

Likewise, even if the electrode wiring 34c reaches the lower electrode 6a of the capacitor 6, the isolated island formation of the wiring 34c enables substantial point contact thereof with the lower electrode 6a. Accordingly, even if the electrode wiring 34c reaches the lower electrode 6a, it is possible to suppress film stress on contact interfaces among the wiring 34c, the lower electrode 6a and the capacitive insulating film 6b. As a result, film peeling-off can be made difficult on the lower electrode 6a and the capacitive insulating film 6b.

Next, as shown in FIG. 6, in the same process as that of the first embodiment, a diffusion prevention film 14 is provided on the surface of the interlayer insulating film 8 of the n-th layer on which the electrode plugs 33a, 33b, 33c, the electrode wirings 34a, 34b, 34c, etc., have been formed. Subsequently, an interlayer insulating film 15 of an (n+1)-th layer is formed on a surface of the diffusion prevention film 14. Then, three electrode upper-layer plugs 18a, 18b, 18c, two electrode upper-layer wirings 19a, 19b, etc., are formed in the interlayer insulating film 15.

The electrode upper-layer plug 18a is electrically connected one to one to the electrode wiring 34a. The electrode upper-layer plug 18b is electrically connected one to one to the electrode wiring 34b. Accordingly, the electrode upper-layer wiring 19a is electrically connected to the upper electrode 6c of the capacitor 6 through the electrode upper-layer plugs 18a, 18b, the electrode wirings 34a, 34b, the electrode plugs 33a, 33b, etc. Additionally, the electrode upper-layer plug 18c is electrically connected one to one to the electrode wiring 34c. Accordingly, the electrode upper-layer wiring 19b is electrically connected to the lower electrode 6a of the capacitor 6 through the electrode upper-layer plug 18c, the electrode wiring 34c, the electrode plug 33c, etc.

Thereafter, a desired semiconductor device 35 shown in FIG. 6 is obtained through predetermined steps. That is, the semiconductor device 35 is obtained in which the electrode wirings 34a, 34b, 34c electrically connected to the lower electrode 6a or the upper electrode 6c of the capacitor 6 in the interlayer insulating film 8 in which the capacitor 6 is provided are formed into isolated island shapes so as not to be laid on the edges of the electrodes 6a, 6c of the capacitor 6 thereabove.

As described above, according to the second embodiment, the electrode wirings 34a, 34b, 34c electrically connected to the lower electrode 6a or the upper electrode 6c of the capacitor 6 in the interlayer insulating film 8 are formed into the isolated island shapes as in the case of the electrode plugs 33a, 33b, 33c. Accordingly, it is possible to eliminate almost all fears of electric characteristic failures of the capacitor 6 caused by a film peeling-off-failure in the capacitor 6 or the vicinity thereof, or short-circuiting between the lower electrode 6a and the upper electrode 6c thereof. As a result, effects similar to those of the first embodiment can be obtained.

Furthermore, the electrode wirings 34a, 34b, 34c larger in diameter than the electrode plugs 33a, 33b, 33c are provided between the lower electrode 6a or the upper electrode 6c of the capacitor 6 and the electrode upper-layer plugs 18a, 18b, 18c. Thus, it is possible to reduce wiring resistances between the electrodes 6a, 6c of the capacitor 6 and the electrode upper-layer wirings 19a, 19b. That is, electric characteristics of not only the capacitor 6 but also the semiconductor device 35 can be improved.

Third Embodiment

Figure 7:
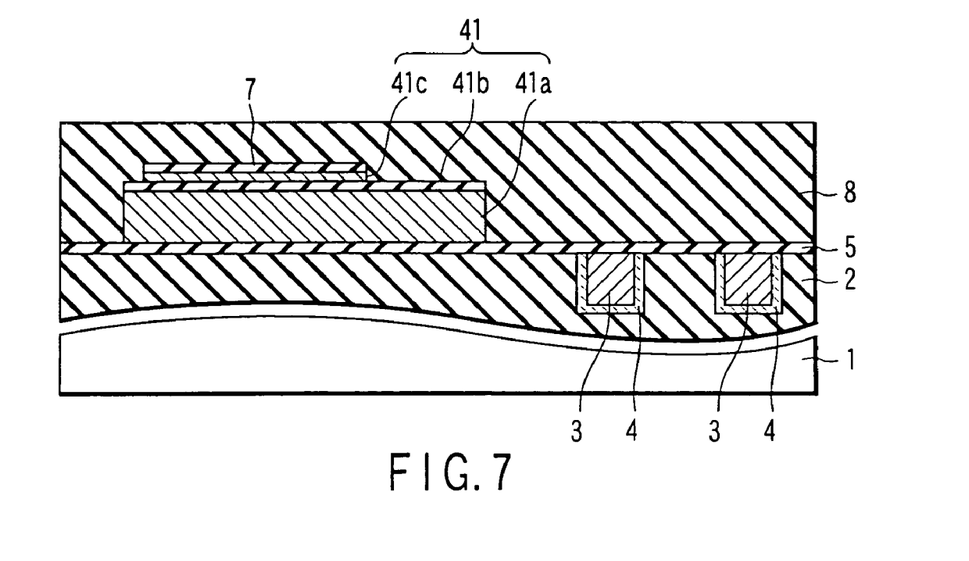
FIG. 7 is a sectional view showing a manufacturing process of a semiconductor device according to a third embodiment.
Figure 8A:
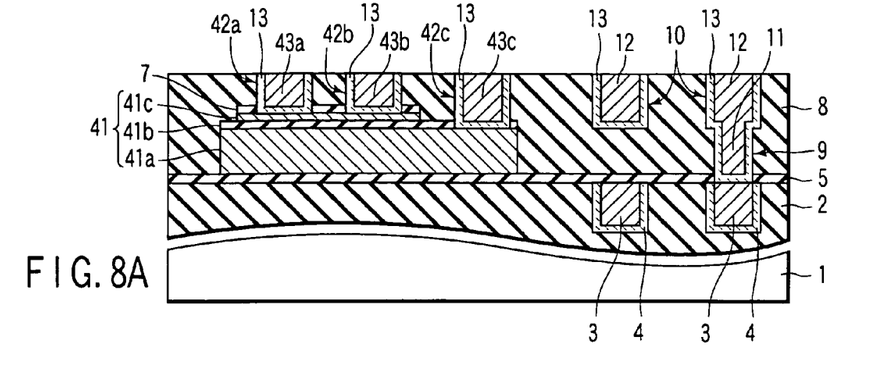
FIG. 8A is a sectional view showing the manufacturing process of the semiconductor device according to the third embodiment.
Figure 8B:
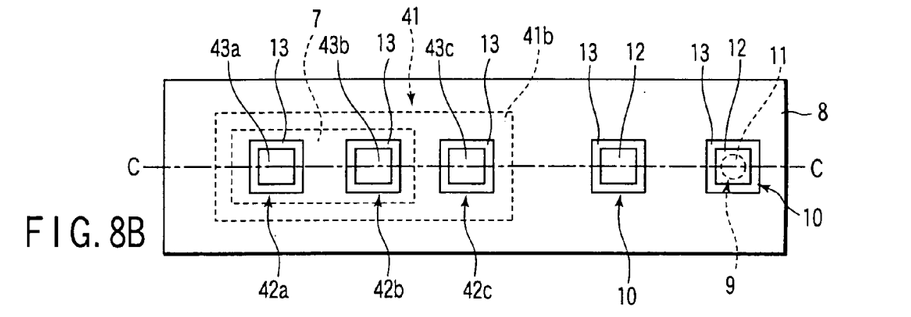
FIG. 8B is a plan view corresponding to FIG. 8A showing the manufacturing process of the semiconductor device according to the third embodiment.
Figure 9:
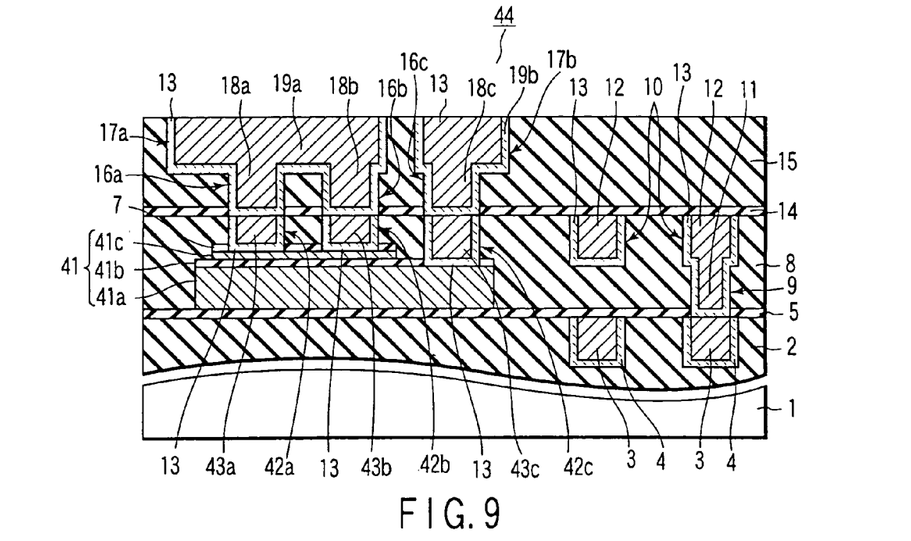
FIG. 9 is a sectional view showing the semiconductor device and the manufacturing process thereof according to the third embodiment.

Next, the third embodiment of the present invention will be described by referring to FIGS. 7 to 9. FIGS. 7 and 8A are sectional views showing a manufacturing process of a semiconductor device according to the embodiment. FIG. 8B is a plan view corresponding to FIG. 8A showing the manufacturing process of the semiconductor device according to the embodiment. FIG. 9 is a sectional view showing the semiconductor device and the manufacturing process thereof according to the embodiment. Incidentally, sections similar to those of the first embodiment are denoted by similar reference numerals, and detailed description thereof will be omitted.

According to the embodiment, different from the first and second embodiments, a lower electrode of a capacitor is formed thicker than an upper electrode thereof. In association, in an interlayer insulating film of an n-th layer, the lower and upper electrodes of the capacitor are electrically connected to electrode wirings formed into isolated island shapes without being passed through any electrode plugs. Hereinafter, the semiconductor device of the embodiment and the manufacturing method thereof will be described collectively in sequence of manufacturing steps.

First, as shown in FIG. 7, in the same process as that of the first embodiment, a diffusion prevention film 5 is provided on a surface of an interlayer insulating film 2 of an (n−1)-th layer on which a lower-layer wiring 3 etc., are formed. Subsequently, a capacitor 41 is provided on the diffusion prevention film 5. As in the case of the capacitor 6 of the first embodiment, the capacitor 41 is formed into a planar shape which comprises a titanium nitride film 41a as a lower electrode, a silicon nitride film 41b as a capacitive insulating film, and a titanium nitride film 41c as an upper electrode. However, as shown in FIG. 7, different from the case of the lower electrode 6a of the capacitor 6 of the first embodiment, the lower electrode 41a of the capacitor 41 of the embodiment is formed thicker than the upper electrode 41c thereof. Subsequently, a protective insulating film 7 is provided to cover a full surface of the upper electrode 41c. Then, an interlayer insulating film 8 of an n-th layer is provided on a surface of the diffusion prevention film 5 to cover the capacitor 41 in which the projective insulating film 7 has been formed. Subsequently, a surface of the interlayer insulating film 8 is planarized by a CMP method.

Next, as shown in FIGS. 8A and 8B, in the same process as that of the first embodiment, a via-hole 9 and a plurality of the recesses 10, 42a, 42b, 42c are formed in the interlayer insulating film 8. The recesses 42a, 42b, 42c are formed similar in position and diameter to the via-holes 9a, 9b, 9c of the first embodiment. That is, the recesses 42a, 42b, 42c are formed similar in position and diameter to the recesses 34a, 34b, 34c of the second embodiment. However, the recesses 34a, 34b and the recess 34c are formed to depths different from each other. The recesses 34a, 34b are formed to depths so that the protective insulating film 7 provided on the upper electrode 41c of the capacitor 41 can be penetrated to expose the surface of the electrode 41c. On the other hand, the recess 34c is formed to a depth so that the capacitive insulating film 41b of the capacitor 41 can be penetrated to expose a surface of the lower electrode 41a thereof. Incidentally, FIG. 8A is a sectional view cut along the chain line C—C of FIG. 8B.

Subsequently, in the same process as that of the first embodiment, barrier metal films 13 and Cu films are embedded inside the via-hole 9 and the recesses 10, 42a, 42b, 42c. As a result, one via-plug 11 of an n-th layer, and five wirings 12, 43a, 43b, 43c of an n-th layer are formed together with the barrier metal films 13. The wirings 43a, 43b, 43c as electrode wirings are formed similar in position and diameter to the electrode wirings 34a, 34b, 34c of the second embodiment. However, the electrode wirings 43a, 43b, 43c are all formed as single wirings without being accompanied by any electrode plugs. The electrode wirings 43a, 43b are formed in thickness to be electrically connected directly to the upper electrode 41c of the capacitor 41 through the barrier metal films 13. Additionally, the electrode wiring 43c is formed in thickness to be electrically connected directly to the lower electrode 41a of the capacitor 41 through the barrier metal film 13. The electrode wirings 43a, 43b, 43c can be referred to as isolated wirings or island-shaped wirings as in the case of the electrode wirings 34a, 34b, 34c of the second embodiment.

Now, for example, it is assumed that the recesses 42a, 42b, 42c are formed in diameters larger than a prescribed size due to an overetching phenomenon, and the electrode wirings 43a, 43b, 43c are formed in diameters larger than a prescribed size. Alternatively, it is assumed that the recesses 42a, 42b, 42c are formed deeper than a prescribed size due to the overetching phenomenon, and the electrode wirings 43a, 43b, 43c are formed longer than a prescribed size. However, as described above, the electrode wirings 43a, 43b, 43c are formed into the isolated island shapes in positions apart from edges of the lower and upper electrodes 41a, 41c of the capacitor 41. Accordingly, even if they are formed larger in diameter or longer than the prescribed size, there is almost no fear that the electrode wirings 43a, 43b will reach the capacitive insulating film 41b or the lower electrode 41a of the capacitor 41. Similarly, even if it is formed larger in diameter or longer than the prescribed size, there is almost no fear that the electrode wiring 43c will reach the upper electrode 41c of the capacitor 41 or the protective insulating film 7.

The isolated island formation of the electrode wirings 43a, 43b enables substantial point contact thereof with the upper electrode 41c of the capacitor 41. Accordingly, it is possible to suppress film stress on contact interfaces among the electrode wirings 43a, 43b, the upper electrode 41c and the protective insulating film 7. As a result, film peeling-off can be made difficult on the upper electrode 41c and the protective insulating film 7. Similarly, the isolated island formation of the electrode wiring 43c enables substantial point contact thereof with the lower electrode 41a of the capacitor 41. Accordingly, it is possible to suppress film stress on contact interfaces among the electrode wiring 43c, the lower electrode 41a and the capacitive insulating film 41b. As a result, film peeling-off can be made difficult on the lower electrode 41a and the capacitive insulating film 41b.

Next, as shown in FIG. 9, in the same process as that of the first embodiment, a diffusion prevention film 14 is provided on the surface of the interlayer insulating film 8 on which the electrode wirings 43a, 43b, 43c, etc., have been formed. Subsequently, an interlayer insulating film 15 of an (n+1)-th layer is formed on a surface of the diffusion prevention film 14. Then, three electrode upper-layer plugs 18a, 18b, 18c, two electrode upper-layer wirings 19a, 19b, etc., are formed in the interlayer insulating film 15.

The electrode upper-layer plug 18a is electrically connected one to one to the electrode wiring 43a. The electrode upper-layer plug 18b is electrically connected one to one to the electrode wiring 43b. Accordingly, the electrode upper-layer wiring 19a is electrically connected to the upper electrode 41c of the capacitor 41 through the electrode upper-layer plugs 18a, 18b, the electrode wirings 43a, 43b, etc. Additionally, the electrode upper-layer plug 18c is electrically connected one to one to the electrode wiring 43c. Accordingly, the electrode upper-layer wiring 19b is electrically connected to the lower electrode 41a of the capacitor 41 through the electrode upper-layer plug 18c, the electrode wiring 43c, etc.

Thereafter, a desired semiconductor device 44 shown in FIG. 9 is obtained through predetermined steps. That is, the semiconductor device 44 is obtained in which the lower electrode 41a of the capacitor 41 is formed thicker than the upper electrode 41c, and the electrode wirings 43a, 43b, 43c formed into isolated island shapes are electrically connected directly to the electrodes 41a, 41c without being passed through any electrode plugs in the interlayer insulating film 8 in which the capacitor 41 is provided.

As described above, according to the third embodiment, the electrode wirings 43a, 43b, 43c electrically connected directly to the lower electrode 41a or the upper electrode 41c of the capacitor 41 in the interlayer insulating film 8 are all formed into the isolated island shapes. Accordingly, it is possible to eliminate almost all fears of electric characteristic failures of the capacitor 41 caused by a film peeling-off failure in the capacitor 41 or the vicinity thereof, or short-circuiting between the lower electrode 41a and the upper electrode 41c thereof. As a result, effects similar to those of the first embodiment can be obtained.

Additionally, the lower electrode 41a or the upper electrode 41c of the capacitor 41 is electrically connected to the electrode upper-layer plugs 18a, 18b, 18c only by the electrode wirings 43a, 43b, 43c. Thus, it is possible to reduce wiring resistances between the electrodes 41a, 41c of the capacitor 41 and the electrode upper-layer wirings 19a, 19b. That is, electric characteristics of not only the capacitor 41 but also the semiconductor device 44 can be improved.

Furthermore, only the electrode wirings 43a, 43b, 43c larger in diameter than the electrode plugs 11a, 11b, 11c of the first embodiment and the electrode plugs 33a, 33b, 33c of the second embodiment are formed above the capacitor 41 in the interlayer insulating film 8. Accordingly, restrictions in the manufacturing process of the semiconductor device 44 can be eased. As a result, the semiconductor device 44 can be manufactured more easily, and yields can be improved compared with the semiconductor devices 20, 35 of the first and second embodiments. In other words, the semiconductor device 44 can be manufactured with higher productivity and at lower costs compared with the semiconductor devices 20, 35 of the first and second embodiments.

Fourth Embodiment

Figure 12A:
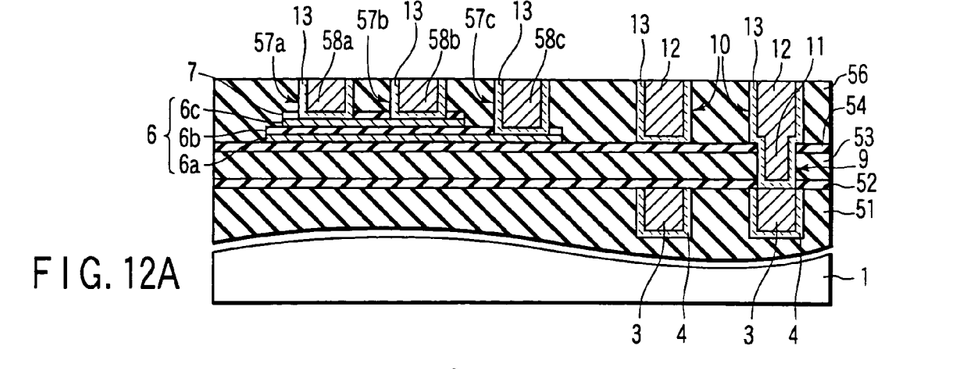
FIG. 12A is a sectional view showing the manufacturing process of the semiconductor device according to the fourth embodiment.
Figure 12B:
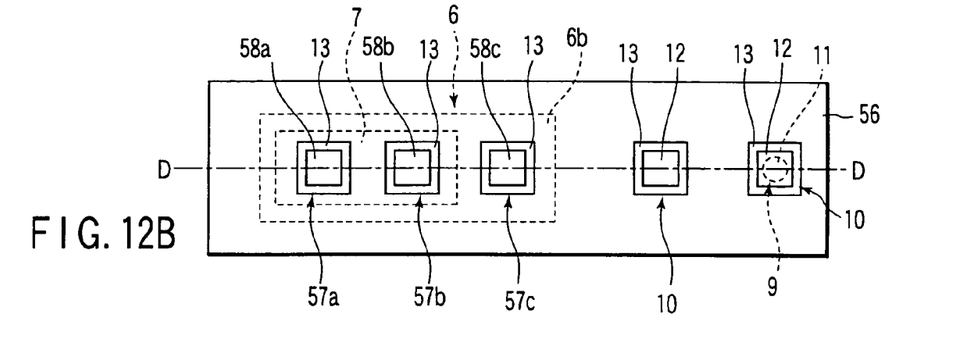
FIG. 12B is a plan view corresponding to FIG. 12A showing the manufacturing process of the semiconductor device according to the fourth embodiment.
Figure 13:
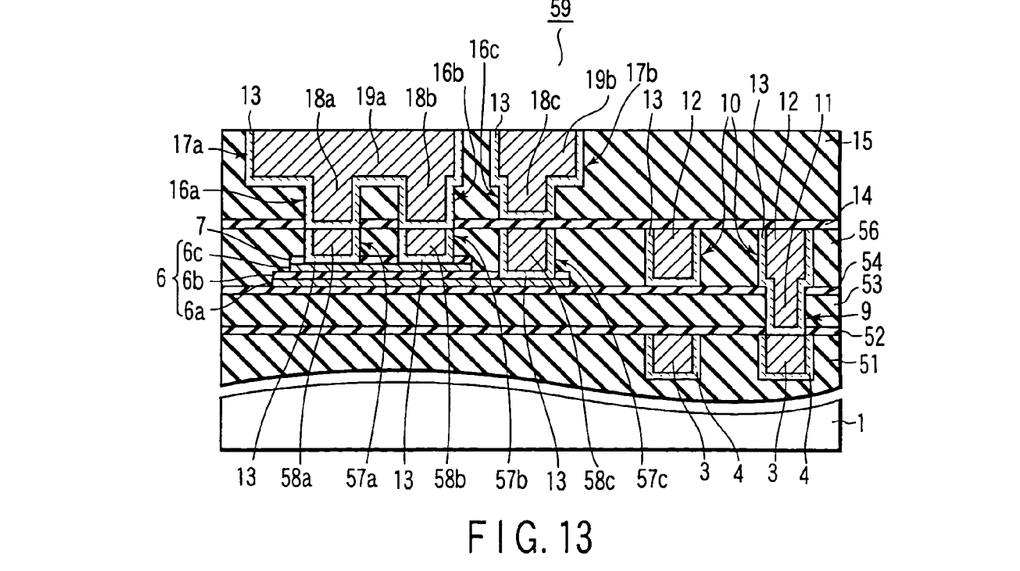
FIG. 13 is a sectional view showing the semiconductor device and the manufacturing process thereof according to the fourth embodiment.

Next, the fourth embodiment of the present invention will be described by referring to FIGS. 10 to 13. FIGS. 10 to 12A are sectional views showing a manufacturing process of a semiconductor device according to the embodiment. FIG. 12B is a plan view corresponding to FIG. 12A showing the manufacturing process of the semiconductor device according to the embodiment. FIG. 13 is a sectional view showing the semiconductor device and the manufacturing process thereof according to the embodiment. Incidentally, sections similar to those of the first embodiment are denoted by similar reference numerals, and detailed description thereof will be omitted.

According to the embodiment, different from the first to third embodiments, an interlayer insulating film of an n-th layer in which a capacitor is provided is formed roughly equal in thickness to a wiring provided therein without being connected to a lower or upper electrode of the capacitor. Then, in the interlayer insulating film of the n-th layer, the lower and upper electrodes of the capacitor are electrically connected to electrode wirings formed into isolated island shapes without being passed through any electrode plugs. Hereinafter, the semiconductor device of the embodiment and the manufacturing method thereof will be described collectively in sequence of manufacturing steps.

Figure 10:
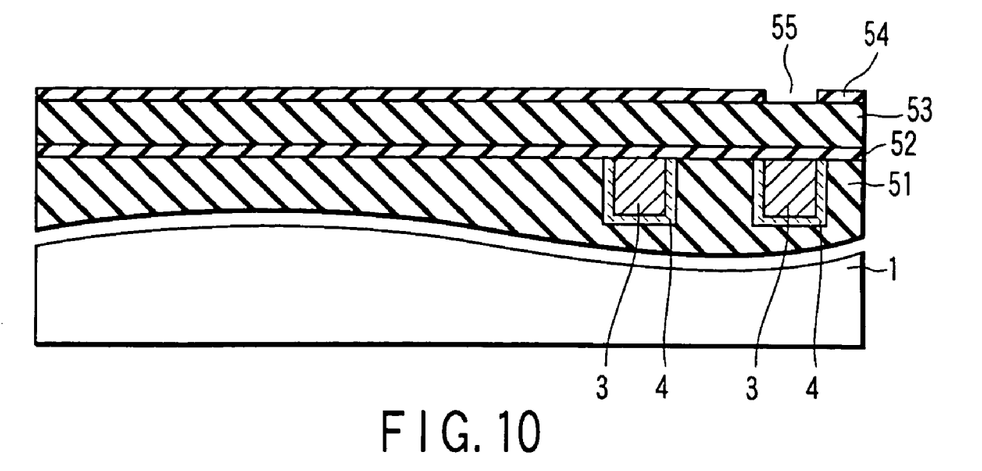
FIG. 10 is a sectional view showing a manufacturing process of a semiconductor device according to a fourth embodiment.

First, as shown in FIG. 10, in the same process as that of the first embodiment, lower-layer wirings 3 etc., are formed in an interlayer insulating film 51 of an (n−2)-th layer (n is an integer of 3 or greater) made of, e.g., d-TEOS. Subsequently, a diffusion prevention film 52 made of, e.g., SiN, is provided on a surface of the interlayer insulating film 51 on which the lower-layer wirings 3 etc., have been formed. Then, an interlayer insulating film 53 of an (n−1)-th layer made of d-TEOS is provided on the diffusion prevention film 5. Subsequently, a diffusion prevention film 54 made of SiN is provided on the surface of the interlayer insulating film 51. Then, by using a lithography technology and an etching technology, a through-hole 55 is formed above a predetermined lower-layer wiring 3 to penetrate the diffusion prevention film 54.

Figure 11:
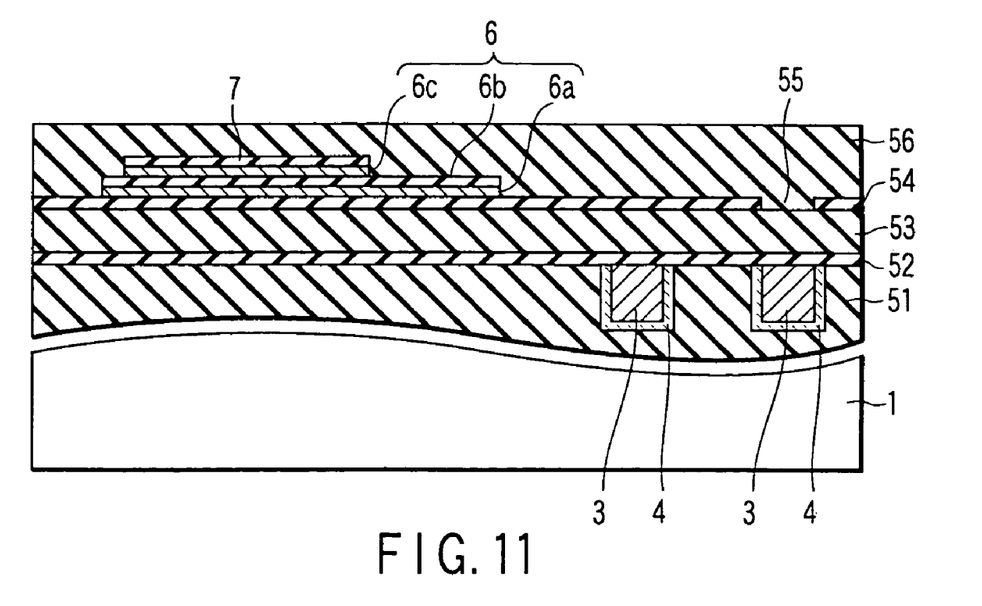
FIG. 11 is a sectional view showing the manufacturing process of the semiconductor device according to the fourth embodiment.

Next, as shown in FIG. 11, as in the case of the first embodiment, a planar capacitor 6 and a protective insulating film 7 are provided on a surface of the diffusion prevention film 52 in which the through-hole 55 is formed. Subsequently, an interlayer insulating film 56 made of d-TEOS is provided on a surface of the diffusion prevention film 54 to cover the capacitor 6 in which the protective insulating film 7 has been formed. In this case, the interlayer insulating film 56 is formed roughly equal in thickness to a wiring provided therein without being connected to the lower electrode 6*a* or the upper electrode 6*c* of the capacitor 6. Specifically, the interlayer insulating film 56 is formed roughly equal in thickness to a wiring 12 of an n-th layer (described later) provided therein and electrically connected to the lower-layer wiring 3. Subsequently, a surface of the interlayer insulating film 56 is planarized by a CMP method.

Next, as shown in FIGS. 12A and 12B, in the same process as that of the first embodiment, a plurality of the recesses 10, 57*a*, 57*b*, 57*c* are formed in the interlayer insulating film 56. In this case, in the recess 10 formed above the through-hole 55, a via-hole 9 communicated with a surface of the lower-layer wiring 3 below is formed integrally through the diffusion prevention film 54 and the interlayer insulating film 53. Additionally, the recesses 57*a*, 57*b*, 57*c* are formed as in the case of the recesses 42*a*, 42*b*, 42*c* of the third embodiment. The recesses 57*a*, 57*b* are formed to depths to penetrate the protective insulating film 7 provided on the upper electrode 6*c* of the capacitor 6, thereby exposing a surface of the electrode 6*c* thereof. The recess 57*c* is formed to a depth to penetrate the capacitive insulating film 6*b* of the capacitor 6, thereby exposing a surface of the lower electrode 6*a* thereof. Incidentally, FIG. 12A is a sectional view cut along the chain line D—D of FIG. 12B.

Subsequently, in the same process as that of the first embodiment, barrier metal films 13 and Cu films are embedded inside the via-hole 9 and the recesses 10, 57*a*, 57*b*, 57*c*. As a result, one via-plug 11 of an n-th layer, and five wirings 12, 58*a*, 58*b*, 58*c* of an n-th layer are formed together with the barrier metal films 13. The wiring 12 above the through-hole 55 is formed in a dual damascene structure in which it is integral with the via-plug 11. This wiring 12 is electrically connected to the lower-layer wiring 3 through the via-plug 11 and the barrier metal film 13.

Additionally, the wirings 58*a*, 58*b*, 58*c* as electrode wirings are formed as in the case of the electrode wirings 43*a*, 43*b*, 43*c* of the third embodiment. The electrode wirings 58*a*, 58*b* are formed in thickness to be electrically connected directly to the upper electrode 6*c* of the capacitor 6 through the barrier metal films 13. The electrode wiring 58*c* is formed in thickness to be electrically connected directly to the lower electrode 6*a* of the capacitor 6 through the barrier metal film 13. The electrode wirings 58*a*, 58*b*, 58*c* can be referred to as isolated wirings or island-shaped wirings as in the case of the electrode wirings 43*a*, 43*b*, 43*c* of the third embodiment.

Accordingly, even if they are formed larger in diameter or longer than a prescribed size, there is almost no fear that the electrode wirings 58*a*, 58*b* will reach the capacitive insulating film 6*b* or the lower electrode 6*a* of the capacitor 6. Similarly, even if it is formed larger in diameter or longer than a prescribed size, there is almost no fear that the electrode wiring 58*c* will reach the upper electrode 6*c* of the capacitor 6 or the protective insulating film 7. Moreover, it is possible to suppress film stress on contact interfaces among the electrode wirings 58*a*, 58*b*, the upper electrode 6*c* of the capacitor 6 and the protective insulating film 7. As a result, film peeling-off can be made difficult on the upper electrode 6*c* of the capacitor 6 and the protective insulating film 7. Similarly, it is possible to suppress film stress on contact interfaces among the electrode wiring 58*c*, and the lower electrode 6*a* and the capacitive insulating film 6*b* of the capacitor 6. As a result, film peeling-off can be made difficult on the lower electrode 6*a* and the capacitive insulating film 6*b* of the capacitor 6.

Next, as shown in FIG. 13, in the same process as that of the first embodiment, a diffusion prevention film 14 is provided on the surface of the interlayer insulating film 56 on which the electrode wirings 58*a*, 58*b*, 58*c*, etc., have been formed. Subsequently, an interlayer insulating film 15 of an (n+1)-th layer is formed on a surface of the diffusion prevention film 14. Then, three electrode upper-layer plugs 18*a*, 18*b*, 18*c*, two electrode upper-layer wirings 19*a*, 19*b*, etc., are formed in the interlayer insulating film 15.

The electrode upper-layer plug 18*a* is electrically connected one to one to the electrode wiring 58*a*. The electrode upper-layer plug 18*b* is electrically connected one to one to the electrode wiring 58*b*. Accordingly, the electrode upper-layer wiring 19*a* is electrically connected to the upper electrode 6*c* of the capacitor 6 through the electrode upper-layer plugs 18*a*, 18*b*, the electrode wirings 58*a*, 58*b*, etc. Additionally, the electrode upper-layer plug 18*c* is electrically connected one to one to the electrode wiring 58*c*. Accordingly, the electrode upper-layer wiring 19*b* is electrically connected to the lower electrode 6*a* of the capacitor 6 through the electrode upper-layer plug 18*c*, the electrode wiring 58*c*, etc.

Thereafter, a desired semiconductor device 59 shown in FIG. 13 is obtained through predetermined steps. That is, the semiconductor device 59 is obtained in which the interlayer insulating film 56 in which the capacitor 6 is provided is formed roughly equal in thickness to the wiring 12 provided therein without being connected to the lower electrode 6*a* or the upper electrode 6*c* of the capacitor 6, and the electrodes 6*a*, 6*c* are electrically connected to the electrode wirings 58*a*, 58*b*, 58*c* formed into isolated island shapes in the interlayer insulating film 56 without being passed through any electrode plugs.

As described above, according to the fourth embodiment, the electrode wirings 58*a*, 58*b*, 58*c* electrically connected directly to the lower electrode 6*a* or the upper electrode 6*c* of the capacitor 6 in the interlayer insulating film 56 are all formed into the isolated island shapes. Accordingly, it is possible to eliminate almost all fears of electric characteristic failures of the capacitor 6 caused by a film peeling-off failure in the capacitor 6 or the vicinity thereof, or short-circuiting between the lower electrode 6*a* and the upper electrode 6*c* thereof. As a result, effects similar to those of the third embodiment can be obtained.

Incidentally, the foregoing first to fourth embodiments are not limitative of the semiconductor device of the present invention. The constitution or the manufacturing process can be partially changed to various settings, or can be implemented by properly combing various settings as occasion demands.

For example, the plugs 11*a*, 11*b*, 11*c*, 33*a* 33*b*, 33*c* may be formed so that diameters thereof can be about 1 μm or smaller including the barrier metal films 13. Similarly, the wirings 34*a*, 34*b*, 34*c*, 43*a*, 43*b*, 43*c*, 58*a*, 58*b*, 58*c* may be formed so that diameters thereof can be about 1 μm or smaller including the barrier metal films 13.

The materials for forming the plugs 11, 11a, 11b, 11c, 18a, 18b, 18c, 33a, 33b, 33c are not limited to only Cu substances. The plugs 11, 11a, 11b, 11c, 18a, 18b, 18c, 33a, 33b, 33c may be formed by using, e.g., Cu alloys, Al, and Al alloys. Similarly, the materials for forming the wirings 12, 19a, 19b, 34a, 34b, 34c, 43a, 43b, 43c, 58a, 58b, 58c are not limited to only Cu substances. The wirings 12, 19a, 19b, 34a, 34b, 34c, 43a, 43b, 43c, 58a, 58b, 58c may be formed by using, e.g., Cu alloys, Al, and Al alloys.

The plugs 11, 11a, 11b, 11c, 18a, 18b, 18c, 33a, 33b, 33c and the wirings 12, 19a, 19b, 34a, 34b, 34c, 43a, 43b, 43c, 58a, 58b, 58c may be formed by using materials different from layer to layer. The barrier metal films 4, 13 may be formed by using proper materials as occasion demands in accordance with the materials for forming the plugs 11, 11a, 11b, 11c, 18a, 18b, 18c, 33a, 33b, 33c and the wirings 12, 19a, 19b, 34a, 34b, 34c, 43a, 43b, 43c, 58a, 58b, 58c. The barrier metal films 4, 13 can be omitted depending on the materials for forming the plugs 11, 11a, 11b, 11c, 18a, 18b, 18c, 33a, 33b, 33c and the wirings 12, 19a, 19b, 34a, 34b, 34c, 43a, 43b, 43c, 58a, 58b, 58c.

The method for forming the plugs 11, 11a, 11b, 11c, 18a, 18b, 18c, 33a, 33b, 33c and the wirings 12, 19a, 19b, 34a, 34b, 34c, 43a, 43b, 43c, 58a, 58b, 58c is not limited to the embedding method. The plugs 11, 11a, 11b, 11c, 18a, 18b, 18c, 33a, 33b, 33c and the wirings 12, 19a, 19b, 34a, 34b, 34c, 43a, 43b, 43c, 58a, 58b, 58c may be formed by using, e.g., a reactive ion etching method (RIE method).

It is not necessary to form the wirings 12, 19a, 19b, 34a, 34b, 34c in the dual damascene structures. The wirings 12, 19a, 19b, 34a, 34b, 34c may be formed separately from the plugs 11, 18a, 18b, 18c, 33a, 33b, 33c. That is, the wirings 12, 19a, 19b, 34a, 34b, 34c may be formed in so-called single damascene structures. In this case, the wirings 12, 19a, 19b, 34a, 34b, 34c and the plugs 11, 18a, 18b, 18c, 33a, 33b, 33c may be formed by using different materials.

The materials for forming the lower electrodes 6a, 41a and the upper electrodes 6c, 41c of the capacitors 6, 41 are not limited to the titanium nitrides. The electrodes 6a, 41a, 6c, 41c may be formed by using, e.g., tantalum nitrides, ruthenium, or the like. Further, the lower electrodes 6a, 41a and the upper electrodes 6c, 41c may be formed by using different materials.

Additionally, the materials for forming the capacitive insulating films 6b, 41b of the capacitors 6, 41 are not limited to the silicon nitrides. The capacitive insulating films 6b, 41b may be formed by using, e.g., silicon oxides or metal oxides containing predetermined metals. As such metal oxides, for example, alumina, tantalum oxides, titanium oxides, etc., are available. Further, various low relative dielectric constant films or ferroelectric films can be used as the capacitive insulating films 6b, 41b.

Thus, the capacitors 6, 41, the plugs 11, 11a, 11b, 11c, 18a, 18b, 18c, 33a, 33b, 33c, the wirings 12, 19a, 19b, 34a, 34b, 34c, 43a, 43b, 43c, 58a, 58b, 58c the barrier metal films 4, 13, etc., may be formed by using proper materials as occasion demands based on the performance of the desired semiconductor devices 20, 35, 44, 59.

The capacitors 6, 41 are not limited to the planar structures of the first to fourth embodiments. For example, a three-dimensional structure called a stack type, a trench type or the like may be employed. More specifically, the capacitors 6, 41 may be structured in cylinder, box or concave forms.

According to the first and second embodiments, the electrode wiring may be directly connected to the lower electrode 6a or the upper electrode 6c of the capacitor 6 as in the case of the third or fourth embodiment. On the other hand, according to the third and fourth embodiments, the electrode plugs or the electrode wirings of the dual damascene structures may be connected to the lower electrodes 6a, 41a or the upper electrodes 6c, 41c of the capacitors 6, 41 as in the case of the first or second embodiment.

Additionally, according to the third embodiment, the upper electrode 41c of the capacitor 41 may be formed thicker than the lower electrode 41a. Alternatively, the lower and upper electrodes 41a, 41c of the capacitor 41 may be formed thicker than the lower and upper electrodes 6a, 6c of the capacitor 6 of the first and second embodiments.

Additionally, the lower-layer wiring 3 needs not be provided on the layer lower by one than those of the capacitors 6, 41. The lower-layer wiring 3 may be provided on a layer lower by two or more than those of the capacitors 6, 41. Similarly, the electrode upper-layer wirings 19a, 19b need not be provided on layers higher by one than those of the capacitors 6, 41. The electrode upper-layer wirings 19a, 19b may be provided on layers higher by two or more than those of the capacitors 6, 41.

Furthermore, according to the first to fourth embodiments, the n is provided as an integer that is at least 2 or greater, which stands for the number of layer of the interlayer insulating film. But, the n is not limited to such number. The n may be 1 or greater integer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
   a capacitor provided above a substrate and formed by sandwiching a capacitive insulating film between lower and upper electrodes;
   an interlayer insulating film of an n-th layer (n is 1 or greater integer) provided above the substrate to cover the capacitor; and
   a plurality of plugs and a plurality of wirings provided above the substrate,
   wherein an electrode wiring among the wirings which is electrically connected to the lower or upper electrode in the interlayer insulating film of the n-th layer is formed into an isolated island shape so as not to be laid on an edge part of each electrode above the capacitor, and the upper electrode is formed smaller than the lower electrode,
   the lower and upper electrodes are electrically connected to respective electrode upper-layer wiring via respective electrode wirings; and
   the respective electrode upper-layer wiring are among the wiring provided in an interlayer insulating film of an (n+1)-th layer or more.

2. The device according to claim 1, wherein:
   the lower electrode is formed thicker than the upper electrode.

3. The device according to claim 1, wherein;
   the capacitor is provided in the interlayer insulating film of the n-th layer; and
   the interlayer insulating film of the n-th layer is formed roughly similar in thickness to a wiring among the wirings which is provided therein without being connected to the lower or upper electrode.

4. The device according to claim 1, wherein:
the capacitor is formed planar.

5. The device according to claim 1, wherein:
each of the upper and lower electrodes is made of one selected from a titanium nitride, a tantalum nitride, and ruthenium.

6. The device according to claim 1, wherein:
the capacitive insulating film is made of one selected from a silicon nitride, a silicon oxide, and a metal oxide containing a predetermined metal.

7. The device according to claim 6, wherein:
the metal oxide is one selected from alumina, a tantalum oxide, and a titanium oxide.

8. The device according to claim 1, wherein:
the respective electrode upper-layer wirings are electrically connected to the respective electrode wirings via respective electrode upper-layer plugs; and
the respective electrode upper-layer plugs are among die plugs provided in the interlayer insulating film of the (n+1)-th layer.

9. The device according to claim 8, wherein:
each of the electrode upper-layer wirings and the electrode upper-layer plugs is made of one selected from Cu, Al, and an alloy of these metal elements.

10. The device according to claim 1, wherein:
the electrode wiring is electrically connected to the lower or upper electrode via an electrode plug among the plugs; and
the electrode plug is formed into an isolated island shape of a size equal to/smaller than that of the wiring.

11. The device according to claim 10, wherein:
the electrode wiring is formed integrally with the electrode plug.

12. The device according to claim 10, wherein:
diameters of the electrode wiring and the electrode plug are set equal to 1 µm or smaller.

13. The device according to claim 10, wherein:
each of the electrode wiring and the electrode plug is made of one selected from Cu, Al, and an alloy of these metal elements.

14. A semiconductor device comprising:
a capacitor provided above a substrate and formed by sandwiching a capacitive insulating film between lower and upper electrodes;
an interlayer insulating film of an n-th layer (n is 1 or greater integer) provided above the substrate to cover the capacitor;
a plurality of plugs and a plurality of wirings provided above the substrate; and
a protective insulating film formed on a surface of the upper electrode to protect the upper electrode separately from the interlayer insulating film of the n-th layer;
wherein an electrode wiring among the wirings which is electrically connected to the lower or upper electrode in the interlayer insulating film of the n-th layer is formed into an isolated island shape so as not to be laid on an edge part of each electrode above the capacitor,
the lower and upper electrodes are electrically connected to respective electrode upper-layer wirings via respective electrode wirings; and
the respective electrode upper-layer wirings are among the wirings provided in an interlayer insulating film of an (n+1)-th layer or more.

15. The device according to claim 14, wherein:
the upper electrode is formed smaller than the lower electrode.

16. The device according to claim 14, wherein:
the capacitor is formed planar.

17. The device according to claim 14, wherein:
each of the upper and lower electrodes is made of one selected from a titanium nitride, a tantalum nitride, and ruthenium.

18. The device according to claim 14, wherein:
the capacitive insulating film is made of one selected from a silicon nitride, a silicon oxide, and a metal oxide containing a predetermined metal.

19. The device according to claim 18, wherein:
the metal oxide is one selected from alumina, a tantalum oxide, and a titanium oxide.

20. The device according to claim 14, wherein:
the respective electrode upper-layer wirings are electrically connected to the respective electrode wirings via respective electrode upper-layer plugs; and
the respective electrode upper-layer plugs are among the plugs provided in the interlayer insulating film of the (n+1)-th layer.

21. The device according to claim 20, wherein:
each of the electrode upper-layer wirings and the electrode upper-layer plugs is made of one selected from Cu, Al, and an alloy of these metal elements.

22. The device according to claim 14, wherein:
the electrode wiring is electrically connected to the lower or upper electrode via an electrode plug among the plugs; and
the electrode plug is formed into an isolated island shape of a size equal to/smaller than that of the wiring.

23. The device according to claim 22, wherein:
the electrode wiring is formed integrally with the electrode plug.

24. The device according to claim 22, wherein:
diameters of the electrode wiring and the electrode plug are set equal to 1 µm or smaller.

25. The device according to claim 14, wherein:
each of the electrode wiring and the electrode plug is made of one selected from Cu, Al, and an alloy of these metal elements.

* * * * *